United States Patent
Xue et al.

(10) Patent No.: US 7,151,470 B1
(45) Date of Patent: Dec. 19, 2006

(54) DATA CONVERTER WITH MULTIPLE CONVERSIONS FOR PADDED-PROTOCOL INTERFACE

(75) Inventors: Ning Xue, Fremont, CA (US); Ramanand Venkata, San Jose, CA (US); Chong H Lee, San Ramon, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 266 days.

(21) Appl. No.: 10/969,450

(22) Filed: Oct. 20, 2004

(51) Int. Cl.
*H03M 7/00* (2006.01)
(52) U.S. Cl. .......................................... 341/61; 341/95
(58) Field of Classification Search .................. 341/61, 341/50, 51, 95, 102, 60
See application file for complete search history.

(56) References Cited

U.S. PATENT DOCUMENTS

| | | | |
|---|---|---|---|
| 4,486,739 A | 12/1984 | Franaszek et al. | 340/347 |
| 6,650,140 B1 | 11/2003 | Lee et al. | 326/39 |
| 6,724,328 B1 | 4/2004 | Lui et al. | 341/101 |
| 6,750,675 B1 | 6/2004 | Venkata et al. | 326/41 |
| 7,064,685 B1 * | 6/2006 | Xue et al. | 341/61 |
| 2001/0033188 A1 | 10/2001 | Aung et al. | 327/141 |
| 2004/0140837 A1 | 7/2004 | Venkata et al. | 327/235 |
| 2006/0077890 A1 * | 4/2006 | Suryavanshi et al. | 370/216 |

OTHER PUBLICATIONS

Lee et al. U.S. Appl. No. 10/059,014, filed Jan. 29, 2002.
Venkata et al. U.S. Appl. No. 10/273,899, filed Oct. 16, 2002.
Venkata et al. U.S. Appl. No. 10/317,262, filed Dec. 10, 2002.
Venkata et al. U.S. Appl. No. 10/317,264, filed Dec. 10, 2002.
Venkata et al. U.S. Appl. No. 10/714,069, filed Nov. 14, 2003.
Walker, Rick, et al., "64b/66b coding update," Presentation at IEEE 802.3ae, Albuquerque, New Mexico (Mar. 6, 2000).

* cited by examiner

*Primary Examiner*—Brian Young
(74) *Attorney, Agent, or Firm*—Fish & Neave IP Group of Ropes & Gray LLP; Jeffrey H. Ingerman (57) ABSTRACT

A data converter, or "gearbox," for a padded protocol interface can perform a number of different conversions—e.g., between 64 and 66 bits, between 24 and 26 bits, or between 48 and 50 bits. This is accomplished by clocking the gearbox at different clock speeds, all derived from the same master clock (which may be recovered from the data in a receiver embodiment) using programmable dividers that allow the user to select the clock speed. When the conversion is not that one with the maximum width for which the gearbox is designed, unused bits are ignored. The converter can also find padding bits, for alignment purposes, in data of different widths, again ignoring unused bits when the data are not the widest for which the converter is designed.

30 Claims, 6 Drawing Sheets

DATA CONVERTER WITH MULTIPLE CONVERSIONS FOR PADDED-PROTOCOL INTERFACE

BACKGROUND OF THE INVENTION

This invention relates to circuitry for handling communication of digital information to which bits are added periodically for synchronization or the like, and more particularly to an interface that allows conversion from one data width to another.

A communication protocol that is increasingly of interest is known as "64b/66b encoding." This is a protocol in which 64 bits of data are scrambled (e.g., to achieve balance between the number of binary ones and the numbers of binary zeros that need to be transmitted so that there is no net direct current in the transmission) and two additional bits having one or more particular sequences are transmitted with each 64 bits as synchronization information. Thus for every 64 bits of information that need to be sent, 64 information bits and two SYNC bits are transmitted. The SYNC bits may be the sequence "10" or "01". Extra bits of this kind may sometimes be referred to herein as "padding." There also may be similar padded protocols with other numbers of bits, such as 8b/10b encoding.

Serial communication of padded information can be a challenge because of possibly complicated clocking issues. For example, 66 bits of information may need to be transmitted in the time in which the data source produces 64 bits of real data. Similarly, the receiver circuitry needs to receive 66 bits in the time in which it will subsequently pass on the 64 bits of real data in that 66-bit transmission.

Circuitry for solving this problem, and allowing the different data widths to operate at different rates, so that the total number of bits transferred during a single clock cycle matches, is known, and is commonly referred to informally as a "gearbox."

In a transmitter gearbox, where the larger number of padded bits used for processing must be converted to the smaller number of bits (generally a power of 2 to be compatible with standard serializer-deserializers) for transmission, data handled internally at one width—e.g., 66 bits—are read into the gearbox in "slices" of that width. After a sufficient number of slices have been buffered, a portion of the first slice—with the number of bits in the portion being equal to the second data width—e.g., 64 bits—is read out. Next, the remaining portion of the first slice—in this case, 2 bits—is read, followed by enough—in this case, 62 bits—of the second slice to make up the second width. This continues until eventually an integral number of slices is read, and then the process repeats. The two sides of the gearbox are clocked by different clocks such that the product of each clock and its respective data width results in the same number of bits being transferred in a given time interval.

The process is reversed for the receiver gearbox, where the smaller number (again, generally a power of 2) of received bits must be converted to the larger number of padded bits for processing. Once again, the data are read into the gearbox in slices having a width of the smaller number of bits—e.g., 64 bits. After a sufficient number of slices have been buffered, the first slice is read out along with a portion of the second slice—with the number of bits in the portion being equal to the number of padding bits (in this case, two bits)—to make up the second data width—e.g., 66 bits. Next, the remainder of the second slice—in this case, 62 bits—is read along with a portion—in this case, four bits— of the third slice to make up the second, larger data width— e.g., 66 bits. Next, the remaining portion of the third slice—in this case, 60 bits—is read, followed by enough—in this case, six bits—of the fourth slice to make up the second width. This continues until eventually an integral number of slices is read, and then the process repeats. As above, the two sides of the gearbox are clocked by different clocks such that the product of each clock and its respective data width results in the same number of bits being transferred in a given time interval.

Such arrangements have heretofore been designed for a particular padded protocol—e.g., 64b/66b encoding. However, many padded protocols, requiring different rate conversions, are in use. In a programmable logic device, it would be desirable to be able to support more than one such protocol, with the selection of protocol—and therefore rate conversion—under the programmable control of the user.

Moreover, after rate conversion, a padded protocol receiver must align the data by finding the padding headers. Because different conversions for different padded protocols result in different widths of data, the alignment circuitry also must be able to operate on different widths of data. It would further be desirable to be able to provide such alignment circuitry, capable of operating on different widths of data under programmable control of the user.

SUMMARY OF THE INVENTION

The present invention includes a data receiver capable of receiving padded data in any one of a number of padded protocols, such as, e.g., 64b/66b encoding, 24b/26b encoding, or 48b/50b (24b/25b if the data rate is doubled) encoding. A user can select which protocol is used. When such a receiver is incorporated into a programmable logic device, the selection of protocol preferably is one of the features that is programmable by a user. The invention also includes a data transmitter capable of transmitting padded data in a similar selection of protocols. Again, when such a transmitter is incorporated into a programmable logic device, the selection of protocol preferably is one of the features that is programmable by a user.

In order to provide the ability to operate under any of the various protocols, the receiver or transmitter incorporates a data converter, or gearbox, that can convert data between different pairs of input and output data widths. Thus, in the example described above, a single gearbox may be able to convert between 64-bit-wide data and 66-bit-wide data, between 24-bit-wide data and 26-bit-wide data, and between 48-bit-wide data and 50-bit-wide data. Using techniques described in copending, commonly-assigned U.S. patent application Ser. No. 10/969,448, filed concurrently herewith and hereby incorporated by reference herein in its entirety, the latter conversion (48b/50b) may be accomplished as a 24b/25b conversion at twice the data rate. Similarly, the 64b/66b conversion may be accomplished as a 16b/22b conversion at 3–4 times the data rate.

In order to accommodate the different conversion ratios, a plurality of different clocks are required. Preferably, a data converter according to the present invention includes a plurality of clock dividers so that a single master clock signal can be divided to provide all of the necessary clock signals. In addition, although the register width of the converter would preferably be that required for the widest of the different conversions for which the data converter is capable, the multiplexers that read the data out of, or into, the registers preferably are controlled in such a way that, when the data width is narrower than the maximum data width, they ignore the unused portions of the registers.

In a receiver, the incoming data, after conversion from its received width to its framed, padded width, must be aligned. That is, the padding bits must be found so that the data can be aligned according to its original word boundaries and the padding bits discarded. One way of doing that is to scan the incoming data and, each time a sequence of bits is encountered that could be the padding bits, skipping a number of bits equal to the unpadded data width and then again examining to see if a sequence of padding bits is again encountered. This could be repeated a desired number of times to be certain that if the pattern repeats, the repetition is not a coincidence. The data converter according to the invention preferably allows a user to programmably set the number of bits to skip so as to be able to perform this function on any one of a number of data widths, and to programmable set the number of repetitions required before coincidence is ruled out.

Thus, in accordance with the present invention there is provided a data converter for accepting padded input data at one of a plurality of first data widths each having a corresponding first data rate, and outputting padded data at one of a plurality of second data widths each having a corresponding second data rate. The data converter preferably includes a first number of data register units each of a register width receiving the input. A second number of data selector units each of a selection width and each connected to a transmission conductor route each bit received at the register units to one of the transmission conductors. The transmission conductors transmit the padded output data. A plurality of clock sources provide respective pairs of clocks corresponding to respective ones of the selected pairs of first and second data widths. A programmable clock selector programmably selects a respective pair of clocks corresponding to a respective one of the selected pairs of first and second data widths. The first number, the second number, the register width and the selector width are determined by a widest one of the plurality of first data widths and a widest one of the plurality of second data widths.

In addition, in accordance with the present invention there is provided a aligner for finding padding bits in received data that may have one of a plurality of first data widths exclusive of the padding bits and one of a plurality of second data widths inclusive of the padding bits. The aligner includes a register of register width at least n, where n is a largest possible difference, among the pairs of first and second data widths, between said second data width and said first data width. A monitor detects each occurrence, in the padded data, of a pattern of p bits signifying potential padding bits, where p≦n. A verifier examines p additional bits separated from each occurrence of potential padding bits by a number of bits, to determine if the additional bits also match a pattern signifying potential padding bits. A decision unit marks the potential padding bits as padding bits after a sufficient number of such matches.

The invention also includes a receiver incorporating a converter according to the invention, and an aligner according to the invention.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
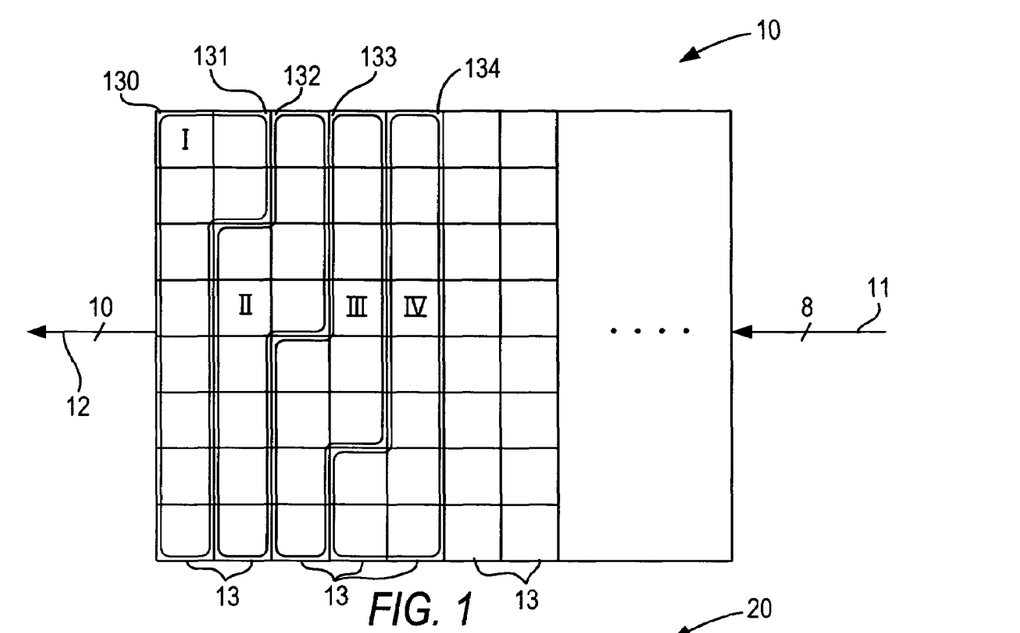
FIG. 1 is a schematic illustration of the operation of data converters of the type of which the present invention is an improvement, where the output data stream is wider than the input data stream.

Operation of a data converter, or gearbox, generally, is illustrated in FIG. 1, which shows a conceptual representation of a gearbox 10 of a type in which the output data stream is wider than the input data stream. For ease of illustration, a case of 8b/10b encoding will be illustrated, but the principles are the same in the case of 64b/66b encoding, or any other encoding scheme in which the output data stream is wider than the input data stream. As shown, input data stream 11 is 8 bits wide while output data stream 12 is 10 bits wide. Gearbox 10 is divided into a plurality of 8-bit-wide "slices" 13. As discussed below, one embodiment of the actual construction of gearbox 10 and slices 13 may include various registers and multiplexers, but for purposes of FIG. 1 it is sufficient that slice 13 is, in this example, 8 bits wide.

Input data 11 sequentially fills slices 13. At the output, 10 bits are read out. Thus, in cycle I, 8 bits are read from slice 130, along with two bits from slice 131, to make up 10 bits. 6 bits remain in slice 131. In cycle II, the 6 bits remaining in slice 131 are read out, along with 4 bits from slice 132, leaving 4 bits in slice 132. In cycle III, the 4 bits remaining in slice 132 are read out, along with 6 bits from slice 133, leaving 2 bits in slice 133. In cycle IV, the 2 bits remaining in slice 133 are read out along with all 8 bits in slice 134. The sequence begins again on the fifth cycle.

Figure 2:
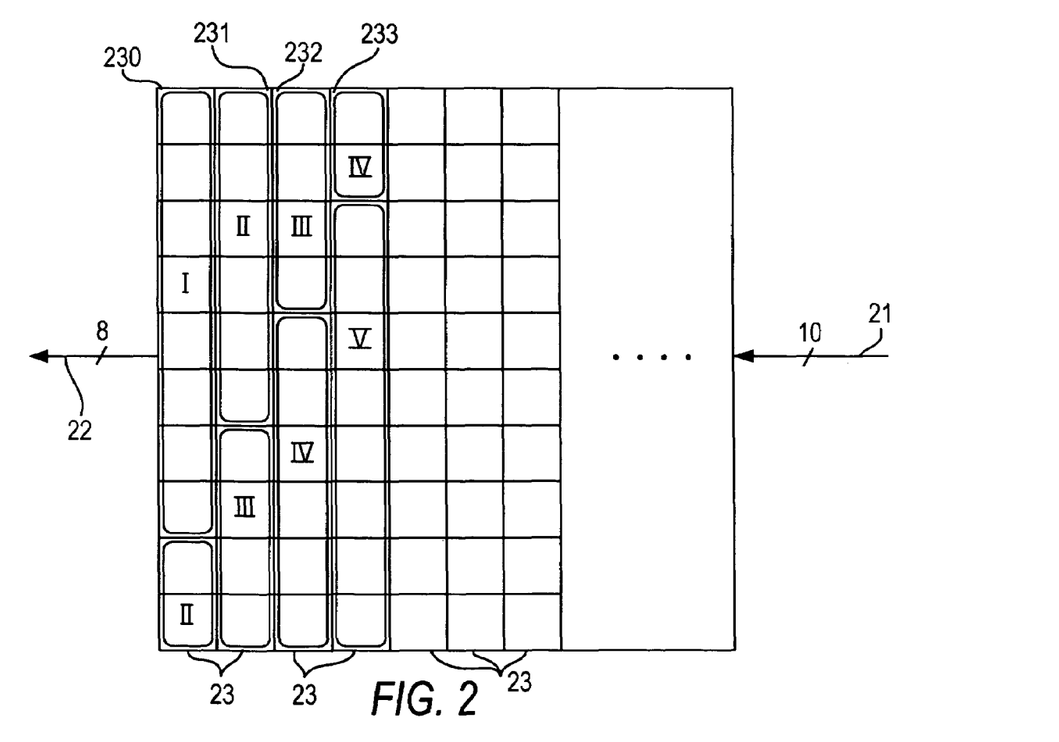
FIG. 2 is a schematic illustration of the operation of a data converter similar to that in FIG. 1, where the input data stream is wider than the output data stream.

As shown in FIG. 2, the operation of gearbox 20, where the input data stream 21 is 10 bits wide while output data stream 22 is 8 bits wide, is similar. Input data 21 sequentially fills slices 23. At the output, 8 bits are read out. Thus, in cycle I, 8 bits are read from slice 230, leaving two bits in slice 230. In cycle II, the 2 bits remaining in slice 230 are read out along with 6 bits from slice 231, leaving 4 bits in slice 231. In cycle III, the 4 bits remaining in slice 231 are read out, along with 4 bits from slice 232, leaving 6 bits in slice 232. In cycle IV, the 6 bits remaining in slice 232 are read out along with 2 bits from slice 233, leaving 8 bits in slice 233. In cycle V, the 8 bits remaining in slice 233 are read out. The sequence begins again on the sixth cycle.

If, hypothetically, there were a 4b/6b encoding scheme, then there would be unused bits in each slice in the examples of FIGS. 1 and 2. In accordance with the present invention, those bits are ignored. Conceptually, in the FIG. 1 case the bits are read out of each slice serially, and a system according to the invention would "known" when to ignore the unused bits (which may be empty or may contain indeterminate data). Similarly, in the FIG. 2 case, the bits are written serially into each slice, and a system according to the invention would "known" when to stop writing data into a slice and start at the beginning of the next slice. As a practical matter, in one preferred embodiment a gearbox is constructed from registers and multiplexers, and in accordance with the invention, when certain data are to be ignored, the control inputs of the multiplexers will be provided with signals that do not select register locations that contain data that should be ignored.

Figure 3:
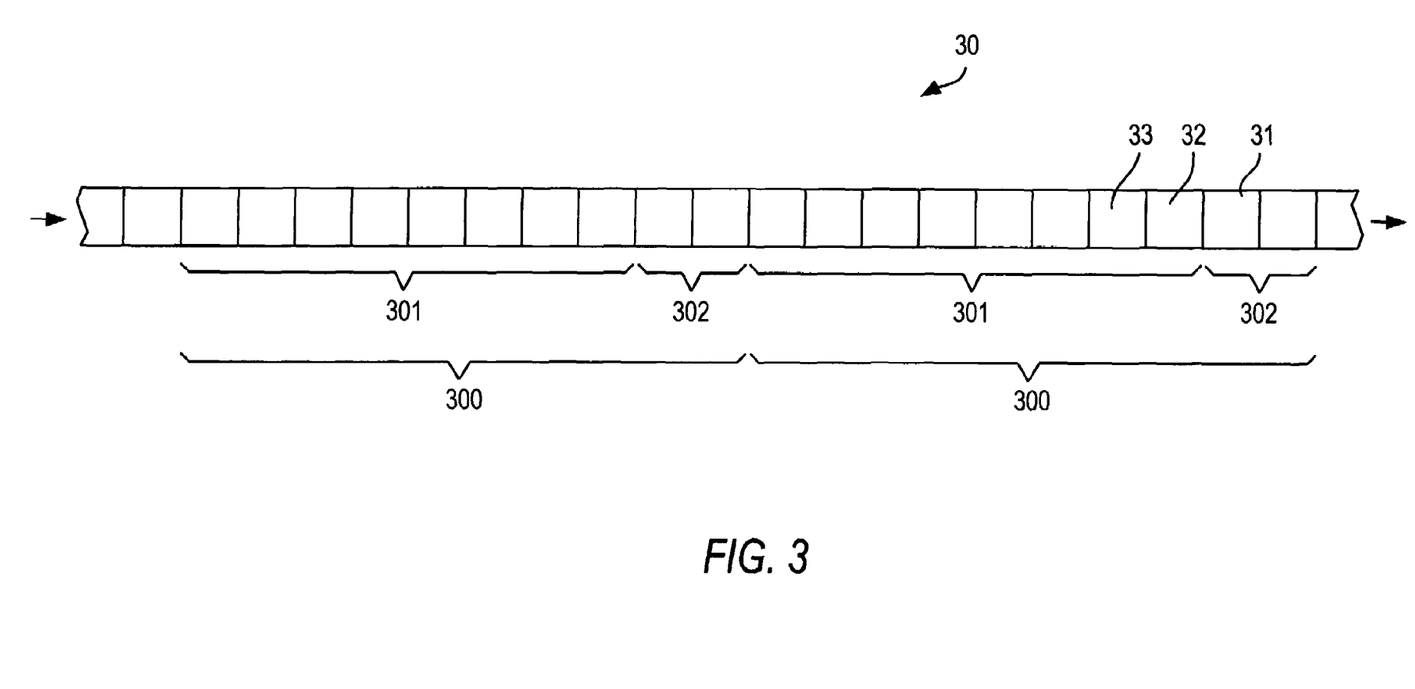
FIG. 3 is a schematic illustration of the operation of an alignment module of which the present invention is an improvement.

Operation of the known alignment process when such data are received is diagrammed in FIG. 3. It will be apparent that alignment is necessary only at the receiver end where a data stream is received and one does not know where the word boundaries are. At the transmitter end, the system is creating the data to be sent, and therefore is intrinsically aware of the boundary locations.

FIG. 3 shows an arbitrary stream 30 of data as may be received at a receiver of the type just described, using 8b/10b encoding. Although the boundaries are not known, data stream 30 includes a continuous series of 10-bit groupings 300, each containing an 8-bit word led by two padding bits. What is known is that each pair of padding bits preferably may be either "01" or "10" (but not "00" or "11"). Each bit that is received is treated as a potential first bit in a pair of padding bits. Thus, if a first bit is "0" then if the next (second) bit is a "1", those two bits are considered a potential pair of padding bits (as they would be if they are, respectively, a "1" and a "0"). At the same time, the second bit also is treated as potentially the first bit in a pair of padding bits. For example, if the first three bits received (31, 32, 33) are "010", then both the first and second (31, 32), and second and third (32, 33), bits are treated as potential pairs of padding bits. However, if the first three bits (31, 32, 33) are "100", the first and second bits (31, 32) would be treated as potential pairs of padding bits, but the second and third bits (32, 33) would not. As stated, each bit is treated as a potential first padding bit.

For each potential pair of padding bits that is identified, the location of the potential pair is noted, and then the next m bits 34 are skipped, where m is the number of unpadded data bits (8 bits in the 8b/10b example, but 64 bits in a 64b/66b case, etc.), and the next two bits after that are examined to see if they also are a potential pair of padding bits. If they are not also a potential pair, that pair is discarded. If they are another potential pair, then either they and the potential pair are deemed padding bits and the data is able to be read from then on, or, more likely, the next m bits would be skipped again and the following two bits examined to make sure that the first match was not a coincidence. In practice, the latter course preferably would be followed a relatively large number of times—e.g., 64 times—because with only four possibilities for any two-bit grouping, and two of those four possibilities representing potential padding bits, even several matches in a row could still be a coincidence. However, to allow for the possibility of bit errors, a certain number of repetitions would be allowed to be non-matches. For example, in the case where 64 repetitions are required, up to 16 of those repetitions may be allowed to be non-matches while still reporting those bit positions as header bits.

Sufficient resources to keep track of all potential padding bits, and where the next potential match for a particular set of potential padding bits will occur, must be provided. However, it is not necessary to retain all of the data examined prior to determining the alignment. While they can be retained at the cost of extra memory, those data may be allowed to become lost as part of the "handshake" process and the system will request their retransmission after alignment. Indeed, a high-speed serial interface of this type operates so fast that it would be impractical after alignment to buffer newly-received data while old, retained data are reexamined.

In the hypothetical 4b/6b encoding described above, in accordance with the present invention after each potential pair of padding bits, four bits would be skipped before the next potential pair of padding bits is examined. This could be done in two ways. First, the unused bits could be ignored at the gearbox level, with data shifted out of the gearbox being true six-bit-wide four-plus-two-bit padded data, in which case the alignment module would simply count four bits between potential pairs of padding bits. Second, the data shifted out of the gearbox could in every case be ten-bit-wide eight-plus-two-bit padded data, with the system configured to ignore or skip over the four extra bits (whose contents could be fixed as 0's or as 1's, or could be indeterminate). The same two implementations could be used with any other sets of data widths, such as in a system designed for a maximum width of 64b/66b, but also used for, e.g., 24b/26b data or 48b/50b data. In such a system, for example, 40 bits would be ignored in the 24b/26b case.

The invention will now be described with reference to FIGS. 4–8.

Figures 4, 5:
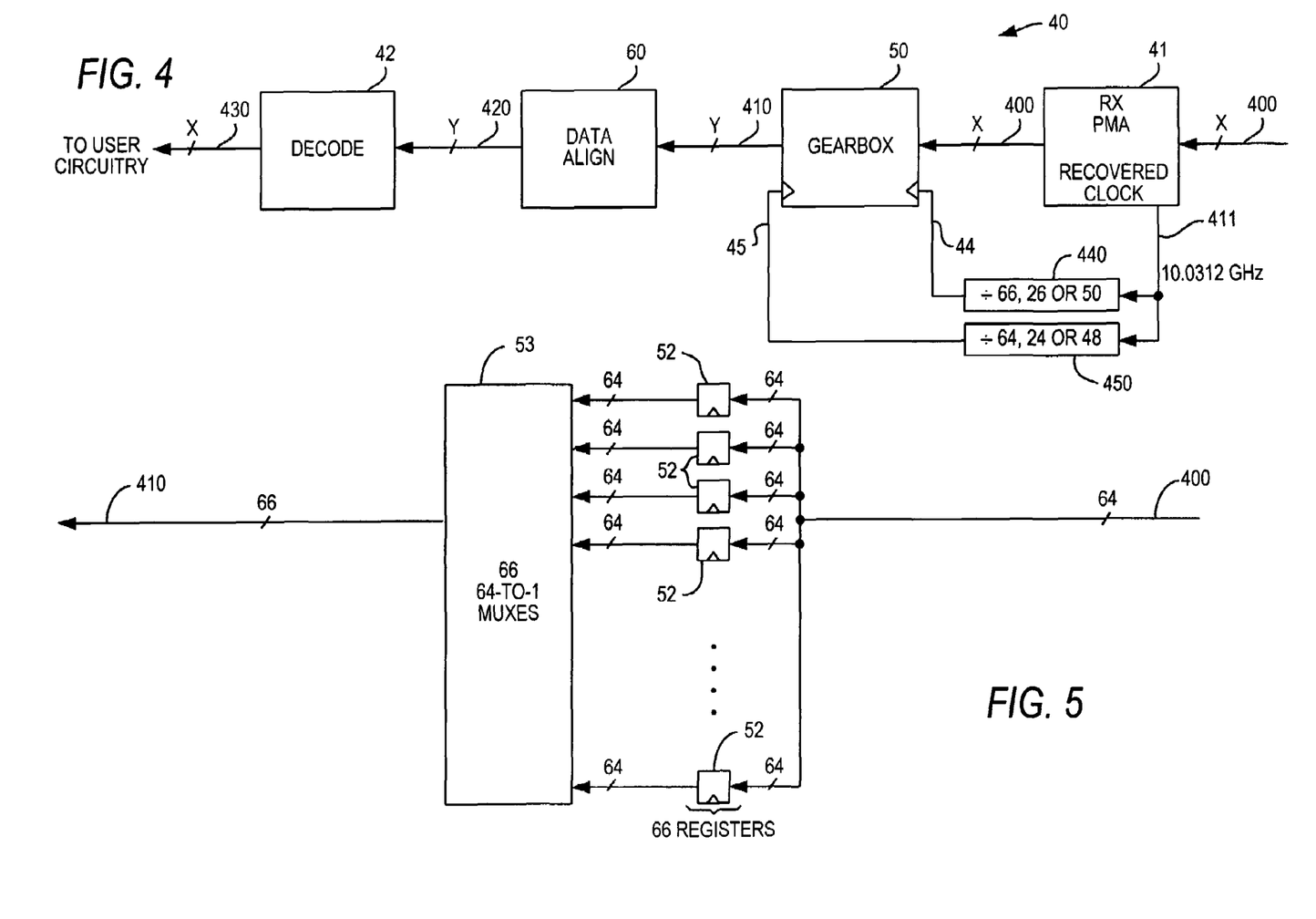
FIG. 4 is a schematic block diagram of a padded protocol receiver including a data converter in accordance with the present invention.
FIG. 5 is a schematic block diagram of the data converter shown in FIG. 4.

FIG. 4 shows a padded protocol receiver 40 incorporating a data converter (gearbox) 50 in accordance with the present invention. Receiver 40 preferably includes physical medium attachment ("PMA") module 41, gearbox 50, data alignment module 60 and decoder 42.

In this example, data 400 of width x are received by receiver PMA module 41 from an external source. Although transmitted as x-bit-wide data, the data are actually y-bit data (y>x), encoded from x-bit source data using xb/yb encoding. The x-bit-wide y-bit received data 400 are conducted to gearbox 50 where they are converted to y-bit-wide y-bit data 410. These y-bit-wide y-bit data 410 are the data as encoded at the source from the original x-bit source data, and including y-x padding bits in every y bits of data. Normally, the number of padding bits is 2, but other numbers of padding bits could be used. Common xb/yb encoding schemes include 64b/66b encoding, 48b/50b encoding and 24b/26b encoding. Thus, in one embodiment of the present invention, receiver 40 is configured to accommodate those three schemes. Thus, various components are built to handle input data as wide as 64 bits even though in some configurations they may handle 24-bit or 48-bit data, while other components are built to handle 66-bit data even though in some configurations they may handle 26-bit or 50-bit data. Other combinations of data widths are possible.

As is well known in connection with high-speed serial interfaces of this type, although gearbox 50 has converted the data back to its y-bit format, the beginning and end of each y-bit "word" is not known, and the y-bit groupings 410 output by gearbox 50 (as well as the x-bit groupings output by PMA module 41) are arbitrary. These unaligned y-bit-wide y-bit data 410 are input to data alignment module 60, which outputs aligned y-bit-wide y-bit data groupings 420 that match the y-bit padded data from the original source, before it was converted to x-bit format for transmission. Data alignment module 60 uses well known data alignment techniques to find certain markers (such as the padding bits) in the data, allowing them to be aligned. However, in accordance with the present invention, those techniques are adapted for use with data of different widths, as described below.

After being aligned by data alignment module 60, the aligned data 420 are input to decoder 42, which strips out the padding bits, outputting the original x-bit-wide x-bit source data 430, which is used by the user circuitry of the device of which receiver 40 is a part. Receiver 40 may further include a phase-compensation FIFO circuit (not shown) on the output of alignment module 60, as is well known.

Gearbox 50 preferably is clocked by two clock signals 44, 45 having a ratio y/x, which preferably are derived using suitable clock division techniques from a single source clock recovered from the received data. For example, in a high-speed interface using 64b/66b encoding, the clock 44 for the 64-bit data 400 may be about 161.13 MHz, while the clock 45 for the 66-bit data 410 may be about 156.25 MHz. Both of these clocks may be derived from a single 10.312 GHz clock (10.312 GHz/66≈156.25 MHz, and 10.312 GHz/64≈161.13 MHz), which preferably is recovered from the received data. One clock division technique that may be used to derive these two clocks from a single 10.312 GHz clock may be similar to the technique shown in copending, commonly-assigned U.S. patent application Ser. No. 10/714, 069, filed Nov. 14, 2003, which is hereby incorporated by reference herein in its entirety.

Similarly, for 24b/26b encoding, the clock 44 for the 24-bit data 400 may be about 396.62 MHz, while the clock 45 for the 26-bit data 410 may be about 429.67 MHz. Both of these clocks may be derived from a single 10.312 GHz clock (10.312 GHz/26≈396.62 MHz, and 10.312 GHz/24≈429.67 MHz). And for 48b/50b encoding, the clock 44 for the 48-bit data 400 may be about 206.24 MHz, while the clock 45 for the 50-bit data 410 may be about 214.83 MHz. Both of these clocks may be derived from a single 10.312 GHz clock (10.312 GHz/50≈206.24 MHz, and 10.312 GHz/48≈214.83 MHz).

As seen in FIG. 4, PMA module 41 of receiver 40 recovers a clock 411—preferably 10.312 GHz—from the received data. A first programmable divider 440 preferably divides the recovered clock by, in the embodiment shown, 66, 26 or 50, as selected by the user, to provide clock 44, while a second programmable divider 450 preferably divides the recovered clock by, in the embodiment shown, 64, 24 or 48, as selected by the user, to provide clock 45. Dividers 440, 450 preferably are programmed by the user as part of the programming of a programmable logic device of which receiver 40 preferably is a part.

The details of gearbox 50 are shown in FIG. 5. Gearbox 50 is sized for the widest case for which it will be used. In this embodiment, gearbox 50 is sized for 64b/66b operation. Incoming 64-bit data 400 preferably are input to each of 66 64-bit registers 52, whose outputs preferably are input to 66 64-to-1 multiplexers 53. Registers 52 preferably represent, collectively, the slices 13 described above, and multiplexers 53 preferably function as selectors to select the appropriate bits from each slice in the manner described in connection with the description of FIG. 1, above. The result preferably is a 66-bit data stream 410. Gearbox 50 may be decreased in size in accordance with above-incorporated copending, commonly-assigned application Ser. No. 10/969,448 by speeding up its internal operation, but that is not necessary for, or part of, the present invention.

Although gearbox 50 is designed for 64b/66b operation, it can also be used for 24b/26b operation or 48b/50b operation. In addition to selecting the correct clock as discussed above, in 24b/26b operation or 48b/50b operation, either 16 or 40 bits of incoming data in each register 52 must be ignored. Those data locations may be either filled with a predetermined value (either 0 or 1), or left indeterminate. In either case, they are ignored in reading out the data for conversion to the output width. This preferably is accomplished by providing appropriate control signals for multiplexers 53 so that they do not select any bits from the locations that are to be ignored. Similarly, the output widths are narrowed from 66 to either 26 or 50 by simply not using 40 or 16, respectively, of multiplexers 53 to provide the output. Again, the outputs of the unused ones of multiplexers 53 may be forced to a particular value, or left indeterminate, and in any case ignored by the downstream user circuitry.

Figure 6:
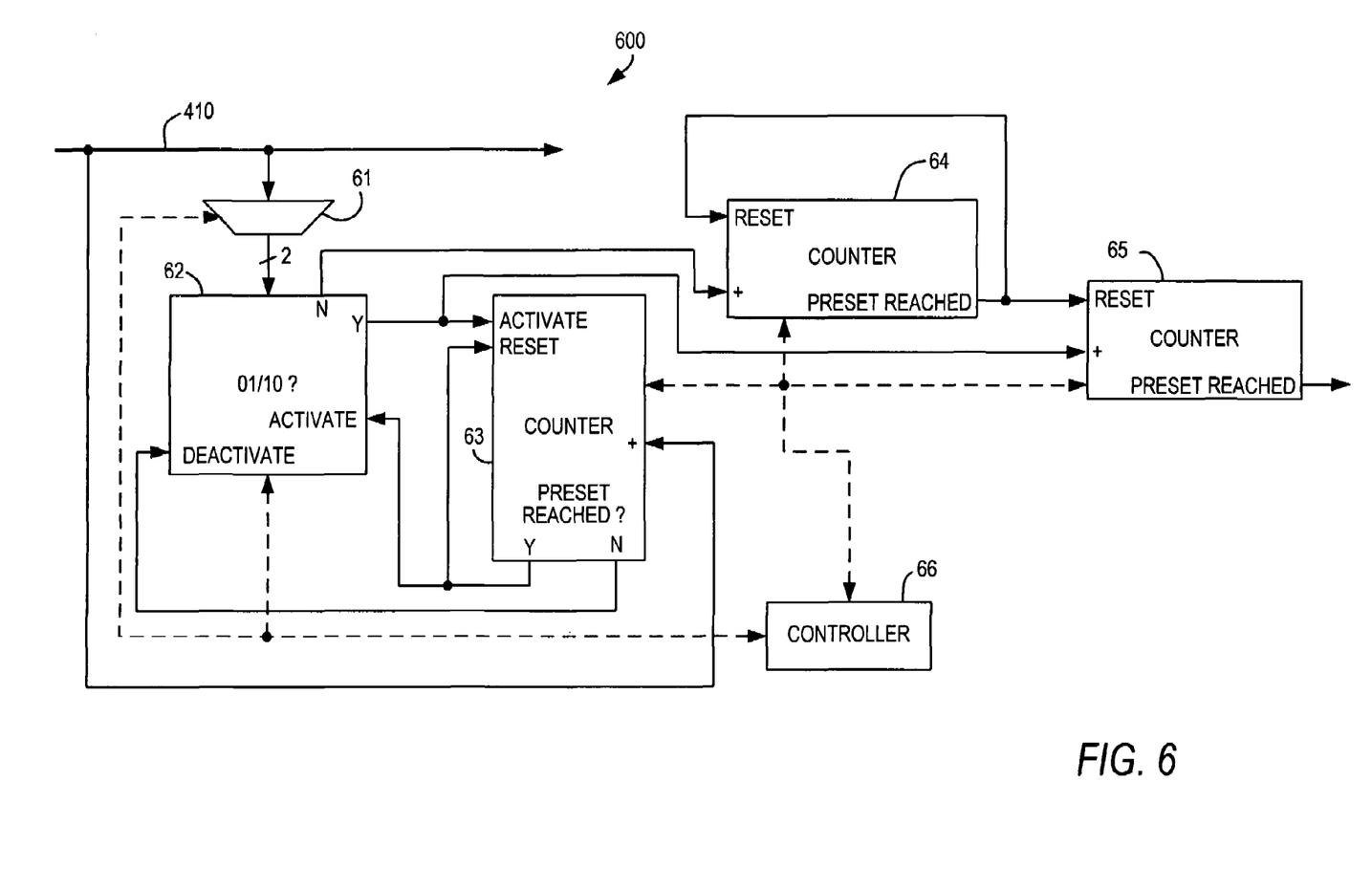
FIG. 6 is a schematic block diagram of an aligner in accordance with the present invention.

Alignment module 60 preferably includes a sync header detector 600, whose operation is shown conceptually in FIG. 6, although the actual circuitry used may vary. Sync header detector 600 preferably includes, at a minimum, a multiplexer 61 that selects, preferably under control of controller 66, two bits out of the incoming bit stream, and a comparator 62 that compares the bits selected by multiplexer 61 to the patterns that indicate padding bits (e.g., "01" or "10"). When there is a match to any pattern indicating potential padding bits, comparator 62 preferably starts a counter 63 that is preset to the relevant data width. Only after the counter 63 indicates that the preset number of bits has passed is comparator 62 activated again.

If comparator 62 when re-activated indicates another match, then a second counter 65 is incremented, and then counter 63 is reset. Each time counter 63 reaches its value, if there is a match, counter 65 is incremented again, but if there is no match, another counter 64 is incremented. The purpose of counter 64 is to allow a certain number of non-matches as discussed above. If that preset number of non-matches is reached, counter 65 is reset to zero, as is counter 64 itself. When counter 65 reaches a predetermined value that is set high enough—e.g., 64 repetitions, regardless of the data width—without being reset by counter 64 (indicating too many non-matches) to make sure that coincidence is eliminated, the bits selected by multiplexer 61 are declared to be padding bits, allowing alignment of the data words.

It should be noted that while multiplexer 61 has been shown as selecting two bits, the number of padding bits could be different, and therefore multiplexer 61 could select a different number of bits. Indeed, there could be programmable modes of operation with different numbers of padding bits, in which case the number of bits selected by multiplexer 61 could vary.

In one preferred embodiment, a particular position in the incoming data stream (e.g., the two most significant bits, as a first attempt) is selected by multiplexer 61 to be checked for the correct number of repetitions (e.g., 64) of header or padding bits. If that position does not yield the header or padding bits, then multiplexer 61 is instructed to select a different position (e.g., the second and third most significant bits, as a second attempt). This continues—even until the two least significant bits—until the padding bits are found. In another preferred embodiment, several overlapping comparisons are in progress at once. In such an embodiment, multiple instances of sync header detector 600 may be present, up to as many as the number of possible positions (65 instances if the widest possible data to be checked is 66 bits wide). Preferably, controller 66 appears only once and keeps track of the association of whichever instance of the remainder of counter 65 reaches the predetermined value with a particular group of candidate padding bits.

Figure 7:
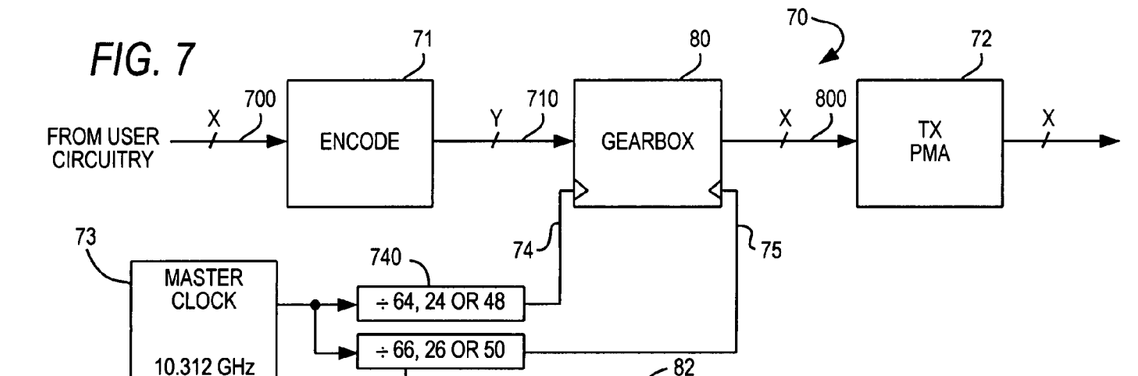
FIG. 7 is a schematic block diagram of a padded protocol transmitter including a data converter in accordance with the present invention.

FIG. 7 shows a padded protocol transmitter 70 incorporating a data converter (gearbox) 80 in accordance with the present invention. Transmitter 70 preferably includes encoder 71, gearbox 80 and physical medium attachment ("PMA") module 72.

In this example, x-bit-wide x-bit data 700 preferably are received by encoder 71 from a user source (i.e., the logical output of a device of which transmitter 70 is a part). Encoder 71 preferably adds appropriate padding bits and outputs appropriately "framed" y-bit-wide y-bit data 710. Gearbox 80 then preferably converts the y-bit-wide y-bit data 710 into x-bit-wide y-bit data 800 in the manner described above, and outputs the x-bit-wide y-bit data 800 to transmitter PMA module 72 for transmission to its destination. No alignment module is needed in transmitter 70, because unlike receiver 40, transmitter 70 is part of the system that generated the source data, and therefore "knows" the word boundaries of the data.

Gearbox 80 preferably is clocked by two programmable clock signals 74, 75, which preferably are derived using suitable clock division techniques from a single source clock. For example, clocks 74, 75 may be selectable from the same clock pairs discussed above—i.e., 156.25 MHz/ 161.13 MHz, 396.62 MHz/429.67 MHz, and 206.24 MHz/ 214.83 MHz—preferably derived from a single 10.312 GHz master clock 73 (in the case of a transmitter, the clock need not be recovered from the data). A first programmable divider 740 preferably divides master clock 73 by, in the embodiment shown, 64, 24 or 48, as selected by the user, to provide clock 74, while a second programmable divider 750 preferably divides the recovered clock by, in the embodiment shown, 66, 26 or 50, as selected by the user, to provide clock 75. Dividers 740, 750 preferably are programmed by the user as part of the programming of a programmable logic device of which receiver 70 preferably is a part.

Figure 8:
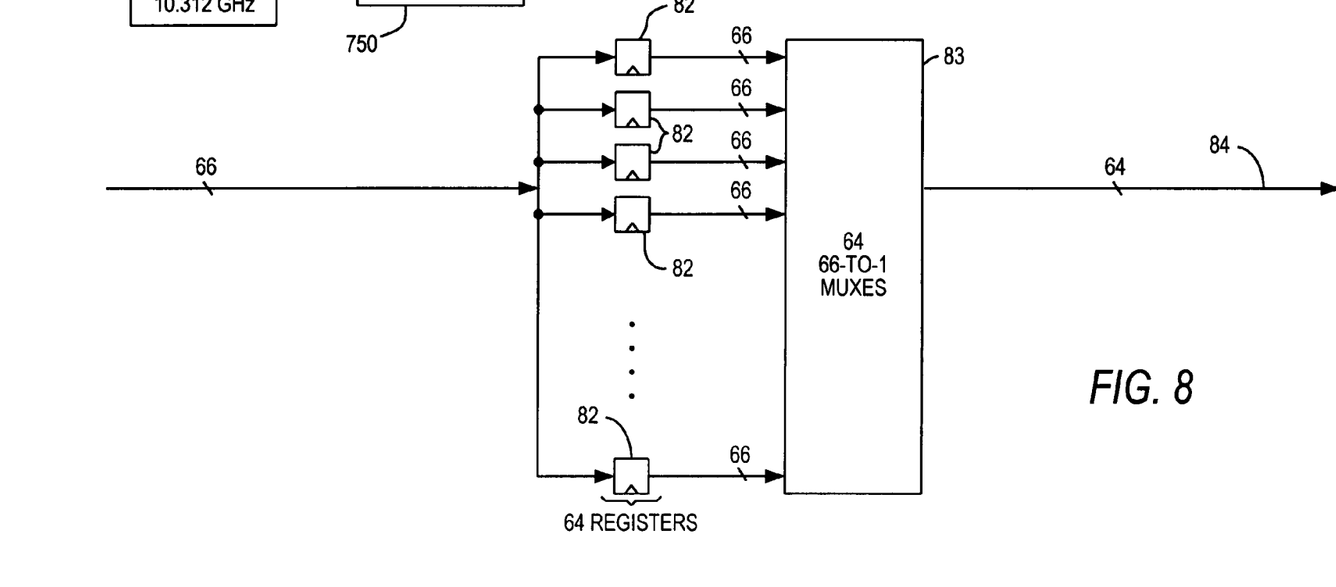
FIG. 8 is a schematic block diagram of the data converter shown in FIG. 7.
Figure 9:
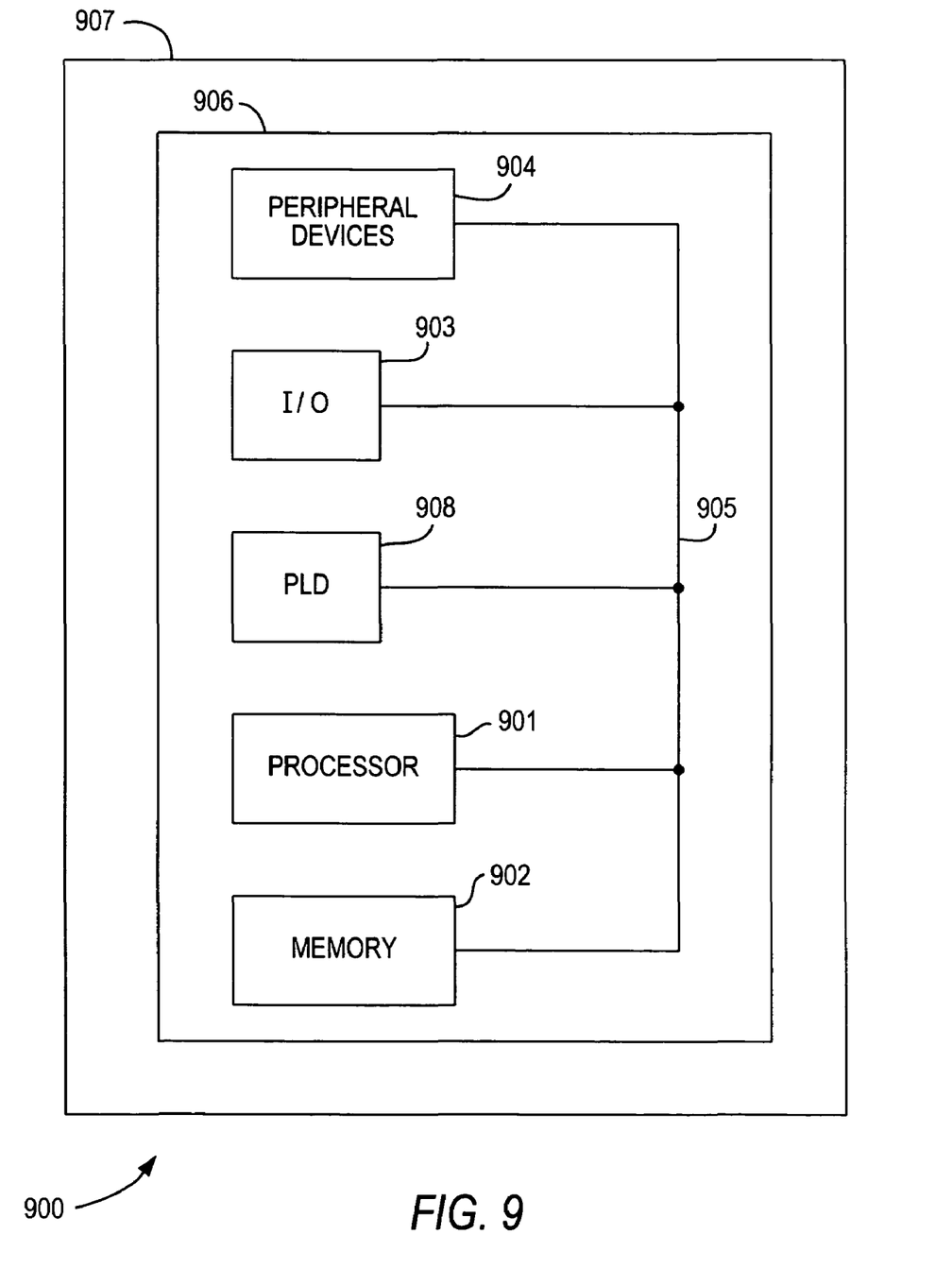
FIG. 9 is a simplified block diagram of an illustrative system employing a data converter in accordance with the present invention.

The details of gearbox 80 are shown in FIG. 8. Gearbox 80 is sized for the widest case for which it will be used. In this embodiment, gearbox 80 is sized for 64b/66b operation. Incoming 66-bit data preferably are input into each of 64 66-bit registers 82, whose outputs preferably are input to 64 66-to-1 multiplexers 83. Registers 82 preferably represent, collectively, the slices 23 described above, and multiplexers 83 preferably function as selectors to select the appropriate bits from each slice in the manner described in connection with the description of FIG. 2, above. The result preferably is a 64-bit data stream 84. Gearbox 80 may be decreased in size in accordance with above-incorporated copending, commonly-assigned application Ser. No. 10/969,448 by speeding up its internal operation, but that is not necessary for, or part of, the present invention.

Like gearbox 50, although gearbox 80 is designed for 64b/66b operation, it can also be used for 24b/26b operation or 48b/50b operation. In addition to selecting the correct clock as discussed above, in 24b/26b operation or 48b/50b operation, either 16 or 40 bits of incoming data in each register 82 must be ignored. Those data locations may be either filled with a predetermined value (either 0 or 1), or left indeterminate. In either case, they are ignored in reading out the data for conversion to the output width. This preferably is accomplished by providing appropriate control signals for multiplexers 83 so that they do not select any bits from the locations that are to be ignored. Similarly, the output widths are narrowed from 64 to either 24 or 48 by simply not using 40 or 16, respectively, of multiplexers 83 to provide the output. Again, the outputs of the unused ones of multiplexers 83 may be forced to a particular value, or left indeterminate, and in any case ignored by the downstream PMA module 72.

A gearbox, with or without an aligner, according to the present invention may be used in a programmable logic device ("PLD"), that is programmably configurable to handle any of a plurality of communication protocols, including a padded protocol as described above.

A PLD 908 incorporating one or one or more transceivers using the components described above according to the present invention may be used in many kinds of electronic devices. One possible use is in a data processing system 900 shown in FIG. 6. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 908 can be used to perform a variety of different logic functions. For example, PLD 908 can be configured as a processor or controller that works in cooperation with processor 901. PLD 908 may also be used as an arbiter for arbitrating access to a shared resources in system 900. In yet another example, PLD 908 can be configured as an interface between processor 901 and one of the other components in system 900. It should be noted that system 900 is only exemplary, and that the true scope and spirit of the invention should be indicated by the following claims.

Various technologies can be used to implement PLDs 908 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A data converter for accepting padded input data at one of a plurality of first data widths each having a corresponding first data rate, and outputting padded data at one of a plurality of second data widths each having a corresponding second data rate, said data converter comprising:

a first number of data register units each of a register width receiving said input;

a second number of data selector units each of a selection width and each connected to a transmission conductor, for routing each bit received at said register units to one of said transmission conductors, said transmission conductors transmitting said padded output data;

a plurality of clock sources for providing respective pairs of clocks corresponding to respective ones of said selected pairs of first and second data widths; and:

a programmable clock selector for programmably selecting a respective pair of clocks corresponding to respective one of said selected pairs of first and second data widths; wherein:

said first number, said second number, said register width and said selector width are determined by a widest one of said plurality of first data widths and a widest one of said plurality of second data widths.

2. The data converter of claim 1 wherein, for any selected pair of first and second data widths, said selected second data width is wider than said selected first data width.

3. The data converter of claim 1 wherein, for any selected pair of first and second data widths, said selected second data width is narrower than said selected first data width.

4. The data converter of claim 1 wherein, when at least one of said first and second data widths from said respective one of said selected pairs of first and second data widths is narrower than said widest one of said one of said first and second data widths, data in a portion of at least one of (a) said data register units, and (b) said data selector units, are ignored.

5. A programmable logic device comprising the data converter of claim 1.

6. A digital processing system comprising:
processing circuitry;
a memory coupled to said processing circuitry; and
a programmable logic device as defined in claim 5 coupled to the processing circuitry and the memory.

7. A printed circuit board on which is mounted a programmable logic device as defined in claim 5.

8. The printed circuit board defined in claim 7 further comprising:
memory circuitry mounted on the printed circuit board and coupled to the programmable logic device.

9. The printed circuit board defined in claim 8 further comprising:
processing circuitry mounted on the printed circuit board and coupled to the memory circuitry.

10. A data receiver comprising:
the data converter of claim 1, wherein, for any selected pair of first and second data widths, said selected second data width is wider than said selected first data width; and
an aligner for finding padding bits in said padded output data; said aligner comprising:
a register for receiving padded data of width m+n, where m is a widest possible one of said first data widths, and n is a largest possible difference, among said pairs of first and second data widths, between said second data width and said first data width,
a monitor for detecting each occurrence, in said padded data, of p bits matching a pattern of bits signifying potential padding bits, where $p \leq n$,
a verifier for examining p additional bits separated from each occurrence of potential padding bits by a number of bits, to determine if said additional bits also match a pattern signifying potential padding bits, and
a decision unit for marking said potential padding bits as padding bits after a sufficient number of said matches.

11. The data receiver of claim 10 wherein said sufficient number of matches is 64.

12. The data receiver of claim 10 wherein said number of bits separating each occurrence of potential padding bits is m+n−p.

13. The data receiver of claim 10 wherein:
said selected first data width is q; and
q<m.

14. A programmable logic device comprising the data receiver of claim 10.

15. A digital processing system comprising:
processing circuitry;
a memory coupled to said processing circuitry; and
a programmable logic device as defined in claim 14 coupled to the processing circuitry and the memory.

16. A printed circuit board on which is mounted a programmable logic device as defined in claim 14.

17. The printed circuit board defined in claim 16 further comprising:
memory circuitry mounted on the printed circuit board and coupled to the programmable logic device.

18. The printed circuit board defined in claim 17 further comprising:
processing circuitry mounted on the printed circuit board and coupled to the memory circuitry.

19. An aligner for finding padding bits in data that may have one of a plurality of first data widths exclusive of said padding bits and one of a plurality of second data widths inclusive of said padding bits; said aligner comprising:
a register for receiving padded data of width m+n, where m is a widest possible one of said first data widths, and n is a largest possible difference, among said pairs of first and second data widths, between said second data width and said first data width;
a monitor for detecting each occurrence, in said padded data, of a pattern of p bits signifying potential padding bits, where $p \leq n$;
a verifier for examining p additional bits separated from each occurrence of potential padding bits by a number of bits, to determine if said additional bits also match a pattern signifying potential padding bits, and
a decision unit for marking said potential padding bits as padding bits after a sufficient number of said matches.

20. The aligner of claim 19 wherein:
said sufficient number of matches is 64.

21. The aligner of claim 19 wherein said number of bits separating each occurrence of potential padding bits is m+n−p.

22. The aligner of claim 19 wherein:
said selected first data width is q; and
q<m.

23. A programmable logic device comprising the aligner of claim 19.

24. A digital processing system comprising:
processing circuitry;
a memory coupled to said processing circuitry; and
a programmable logic device as defined in claim 23 coupled to the processing circuitry and the memory.

25. A printed circuit board on which is mounted a programmable logic device as defined in claim 23.

26. The printed circuit board defined in claim 25 further comprising:
memory circuitry mounted on the printed circuit board and coupled to the programmable logic device.

27. The printed circuit board defined in claim 26 further comprising:
processing circuitry mounted on the printed circuit board and coupled to the memory circuitry.

28. A data conversion method for accepting padded input data at one of a plurality of first data widths each having a corresponding first data rate, and outputting padded data at one of a plurality of second data widths each having a corresponding second data rate, said method comprising:
selecting data bits from said padded input data and routing each selected bit to one of a plurality of transmission conductors as intermediate padded data at an intermediate data width, said plurality of transmission conductors being of sufficient number for a widest one of one of said first and second data widths;
when at least one of said first and second data widths from said respective one of said selected pairs of first and second data widths is narrower than said widest one of said one of said first and second data widths, ignoring, during said selecting, data on a portion of said plurality of transmission conductors; and receiving said intermediate padded data at said intermediate data width, and outputting said padded data at said second data width.

29. The method of claim 28 wherein, for any selected pair of first and second data widths, said selected second data width is wider than said selected first data width.

30. The method of claim 28 wherein, for any selected pair of first and second data widths, said selected second data width is narrower than said selected first data width.

* * * * *